United States Patent
Woodford et al.

(10) Patent No.: US 10,020,357 B2
(45) Date of Patent: Jul. 10, 2018

(54) SENSE RESISTOR SURROUNDINGLY POSITIONED NEAR OR AROUND AND INTEGRATED WITH AN OUTPUT CONNECTION

(71) Applicant: Cirrus Logic International Semiconductor Ltd., Edinburgh (GB)

(72) Inventors: Scott Allan Woodford, Austin, TX (US); John Christopher Tucker, Austin, TX (US); Marc L. Tarabbia, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/094,488

(22) Filed: Apr. 8, 2016

(65) Prior Publication Data
US 2016/0322455 A1   Nov. 3, 2016

Related U.S. Application Data

(60) Provisional application No. 62/145,710, filed on Apr. 10, 2015.

(51) Int. Cl.
| | |
|---|---|
| *H01L 23/52* | (2006.01) |
| *H01L 49/02* | (2006.01) |
| *H01L 27/06* | (2006.01) |
| *H01L 29/06* | (2006.01) |
| *H01L 23/522* | (2006.01) |

(52) U.S. Cl.
CPC .......... *H01L 28/24* (2013.01); *H01L 23/5228* (2013.01); *H01L 27/0629* (2013.01); *H01L 29/0657* (2013.01)

(58) Field of Classification Search
CPC ....... H01L 23/52; H01L 27/06; H01L 27/062; H01L 27/0629; H01L 28/24; H01L 29/06; H01L 29/065; H01L 29/0657
USPC ........................................................ 257/369
See application file for complete search history.

(56) References Cited

U.S. PATENT DOCUMENTS

| | | | |
|---|---|---|---|
| 2005/0127505 A1* | 6/2005 | Alter | H01L 23/3114 257/734 |
| 2010/0072618 A1* | 3/2010 | Camacho | H01L 21/6835 257/738 |
| 2013/0285056 A1* | 10/2013 | Pagan | H01L 22/14 257/48 |

* cited by examiner

*Primary Examiner* — Monica D Harrison
(74) *Attorney, Agent, or Firm* — Norton Rose Fulbright US LLP

(57) ABSTRACT

An integrated sense resistor within an integrated circuit (IC) may be surroundingly positioned near and coupled to a connection such as a pin or ball. The integrated sense resistor may be shaped such that more surface area of the integrated sense resistor is coupled to be positioned closer or in actual contact with the pin or ball than conventional straight layered integrated sense resistor solutions. The integrated sense resistor may be a non-straight shape that entirely surrounds or wraps around a connection to the pin or ball, such as a circular or oval shape, a box or rectangular shape, a triangular shape, or a polygonal shape. The integrated sense resistor may be a non-straight shape that partially surrounds a connection to the pin or ball, such as an open-circular or semi-circular shape, an open-sided box or rectangular shape, an open-sided triangular shape, an angular shape, or an open curved shape.

21 Claims, 8 Drawing Sheets

SENSE RESISTOR SURROUNDINGLY POSITIONED NEAR OR AROUND AND INTEGRATED WITH AN OUTPUT CONNECTION

CROSS-REFERENCE TO RELATED PATENT APPLICATIONS

This application claims the benefit of priority of U.S. Provisional Patent Application No. 62/145,710 to Woodford et al. filed on Apr. 10, 2015 and entitled "Methods and Apparatuses for Surrounding Positioning and Coupling a Sense Resistor Near or Around a Chip Scale Package (CSP) Output Ball," which is hereby incorporated by reference in its entirety.

FIELD OF THE DISCLOSURE

The instant disclosure relates to integrated circuits (ICs). More specifically, portions of this disclosure relate to sense resistors integrated with ICs and positioned near or around a chip scale package (CSP) output ball.

BACKGROUND

A sense resistor is used to measure current for a circuit and can be included in or with an integrated circuit (IC). Sense resistors are useful for providing information about one component of an IC to other components of the IC. Some components of an IC may be less "intelligent" components, such as speakers, that have no capability to make decisions or execute logical statements. Other components of the IC may be more "intelligent" components, such as controllers or processors, that have logic circuitry or general processing capability that can process decisions, generate control signals, and/or operate other components within the IC. A sense resistor is one monitoring tool that the more intelligent components may have access to when determining the condition or state of the less intelligent components. Design of the sense resistor is impacted by the IC's design, the IC's application, and/or the levels of currents that need to be measured or tolerated.

One conventional implementation of a sense resistor provides an external sense resistor coupled to components of an IC. FIG. 1 is a circuit schematic showing a circuit accessing an external sense resistor according to one example of the prior art. An example circuit 100 uses an external sense resistor 110 coupled to an IC 120. Circuit 100 includes an output driver 102 and a sense analog-to-digital converter (ADC) 104. Output driver 102 and sense ADC 104 may be part of, but not necessarily all of, circuit 100. Output driver 102 drives an output signal at its output through pin or ball 106. The external resistor 110 and a load 114 are coupled in series between pin or ball 106 and ground 122. An external capacitor 112 is coupled in parallel to the external resistor 110. The sense ADC 104 receives input through pins or balls 108 and 109, and the sense ADC 104 generates an output signal at output 111, which may be internal to an IC 120. The external resistor 110 is coupled across pins or balls 108 and 109. A short circuit switch 116 is coupled to pin 109, which may be used to test a robustness of the output driver 102 and resistor 110. Current through external resistor 110 generates a voltage across external resistor 110 that can be read as a voltage difference across the pins or balls 108 and 109 as an analog signal and converted to a digital signal by sense ADC 104. That digital signal may be used as feedback for an intelligent component, such as a controller in the IC 120.

In the design of circuit 100, external resistor 110 is not part of the IC 120, allowing the resistance value for external sense resistor 110 to be selected such that external resistor 100 can withstand or tolerate large short-circuit currents. However, a sense resistor with a high or higher resistance value typically equates to a larger sized resistor. Further, sizing a sense resistor with a high or higher heat dissipation value to allow tolerance of larger currents generally also results in a larger size resistor. A larger resistor consumes more space or area in an electronic device, which is disadvantageous and particularly disadvantageous in mobile devices. Also, as shown in example circuit 100, the use of external resistor 110 typically requires one or two additional pins or balls for the IC 120, shown as pins or balls 108 and 109. Additional pins or balls generally require additional layout and/or pin-out and also require additional space on the IC 120. Furthermore, external path 107 to the external resistor 110 and load 114 has an inherent inductance. If this inductance is not offset, then it may cause voltage ringing spikes for circuit 100. Thus, the use of external resistor 110 necessitates use of external capacitor 112 to offset the inductance. This external capacitor 112 consumes additional space and area in an electronic device that includes circuit 100.

An alternative solution to an external resistor is to integrate the resistor into the IC. FIG. 2 is a circuit schematic showing a circuit having an integrated sense resistor according to one example of the prior art. An example circuit 200 includes an IC 220 with an integrated resistor 202. Circuit 200 is similar to circuit 100 and includes output driver 102 and sense ADC 104. Similar to circuit 100, output driver 102 and sense ADC 104 are included in an IC, and output driver 102 drives an output signal to pin or ball 106. However, instead of external resistor 110 that is outside of the IC 120, circuit 200 includes integrated sense resistor 202 internal to the IC 220. The integrated resistor 202 is coupled between the output driver 102 and pin or ball 106. Internal nodes 204 and 206 couple integrated resistor 202 to sense ADC 104. Load 114 is coupled between pin or ball 106 and ground 122.

Designing integrated resistor 202 to withstand or tolerate large short-circuit currents requires the integrated resistor 202 to be large in size and consume space and area. The larger area for an IC makes it more challenging to symmetrically lay out the circuit to eliminate mismatches, such as mismatches due to having more than one source of current (e.g., current sources for a p-channel metal-oxide-semiconductor field-effect transistor (MOSFET) (PMOS) driver device and an n-channel metal-oxide-semiconductor field-effect transistor (MOSFET) (NMOS) driver device). The requirements for circuit symmetry further constrain the layout of circuit components, such as the layout for the integrated resistor 202, the current source, the pin or ball, and/or the internal nodes 204 and 206.

These symmetry requirements are illustrated in FIG. 3. FIG. 3 is a cross-sectional view showing an integrated circuit at a chip-scale package (CSP) level with an integrated sense resistor according to one example of the prior art. Integrated circuit layout 300 includes sense ADC 104 coupled to integrated sense resistor 202, which is coupled to pin or ball 106, such as a Chip-Scale-Package (CSP) output ball. The resistor value for integrated sense resistor 202 is a function of a ratio of its length L to its width W (e.g., L/W), and thus usually has a width W much greater than its length L. In order to maintain symmetry, the ratio L/W needs to be maintained as a constant. Thus, if the length L is made longer, then the width W also will need to be correspondingly made longer, and vice versa if they are made shorter. The integrated resistor 202 may be sensed by ADC 104 through internal sense points 306 and 308 located across the length L. Circuit layout 300 may also include NMOS driver 302 and PMOS driver 304 located at opposite sides of the sense ADC 104 and ball 106. Mismatches among NMOS driver 302 and PMOS driver 304 that provide multiple current sources can and generally do exist. Thus, a line of symmetry 310 needs to be maintained in order to maintain symmetry for integrated circuit layout 300 and reduce/eliminate mismatches. Also, if symmetry for integrated circuit layout 300 is not maintained, then the current values being sensed at the sense points 306 and 308 may not be accurate and/or may be inconsistent.

Shortcomings mentioned here are only representative and are included simply to highlight that a need exists for improved electrical components, particularly for sense resistors and integrated circuits (ICs) that utilize those sense resistors employed in consumer-level devices, such as mobile phones. Embodiments described herein address certain shortcomings but not necessarily each and every one described here or known in the art.

SUMMARY

In some embodiments, an integrated sense resistor may be included within an integrated circuit (IC), and the integrated sense resistor may be surroundingly positioned and coupled to a packaging connection, such as a pin or ball or Chip-Scale Package (CSP) output ball, or be surroundingly positioned around a connection to the packaging connection (e.g., pin or ball). The integrated sense resistor may be shaped such that more surface area of the integrated sense resistor is coupled to be positioned closer or in actual contact with the pin or ball than the prior art straight layered integrated sense resistor solutions such as shown as resistor 202 in FIG. 2. That is, the long straight shape of the prior art resistor 202 causes the size of the resistor 202 to consume a large die area as the resistor 202 needs to accommodate larger currents or larger resistance values. In contrast, by shaping an integrated resistor to be not straight, such as to surround or wrap a connection to a pin or ball of the integrated circuit, the die area for the resistor may be reduced.

The integrated resistor may take on any of a number of shapes that allow the integrated resistor to not be straight. In some embodiments, the integrated sense resistor is made into a non-straight shape that entirely surrounds or wraps around the pin or ball. Such non-straight shapes include, but are not limited to, closed shape resistors such as a circular or oval shape, a box or rectangular shape, a triangular shape, a polygonal shape, etc. In some embodiments, the integrated sense resistor is made into a non-straight shape that only partially surrounds the pin or ball. Such non-straight shapes include, but are not limited to, open shape resistors such as an open-circular or semi-circular shape, an open-sided box or rectangular shape, an open-sided triangular shape, an angular shape, a curved shape, etc.

According to one embodiment, an integrated circuit may include an integrated resistor. The integrated circuit may include a packaging connection, such as an output ball. The integrated circuit may also include a non-straight resistor layer that forms the integrated resistor and that is coupled to the packaging connection (e.g., output ball), wherein the non-straight resistor layer at least partially surrounds the packaging connection or at least partially surrounds a connection to the packaging connection.

In certain embodiments, the non-straight resistor layer may be coupled to the packaging connection (e.g., output ball) such that the non-straight shape resistor layer at least partially surrounds, and optionally entirely surrounds, the packaging connection (e.g., output ball) or a connection to the packaging connection (e.g., output ball), and optionally may be coupled to the packaging connection (e.g., output ball); the non-straight resistor layer may be coupled to the packaging connection (e.g., output ball) such that the non-straight shape resistor layer at least partially surrounds the packaging connection (e.g., output ball); and/or the non-straight shape resistor layer may be coupled to the packaging connection (e.g., output ball) so that the non-straight shape resistor layer entirely surrounds and is in contact with a connection to the packaging connection (e.g., output ball) or the output ball itself.

According to another embodiment, a method of forming an integrated resistor for an integrated circuit may include forming a non-straight resistor layer; and/or coupling the non-straight resistor layer to a packaging connection (e.g., output ball) of the integrated circuit, wherein the step of forming the non-straight resistor layer may include forming the non-straight resistor layer to at least partially surround the packaging connection (e.g., output ball) or a connection to the packaging connection (e.g., output ball).

In certain embodiments, the step of forming the non-straight resistor layer may include shaping the non-straight shape resistor layer to entirely surround the packaging connection (e.g., output ball); and/or the step of forming the non-straight resistor layer may include shaping the non-straight shape resistor layer to partially or entirely surround and be in contact with the packaging connection (e.g., output ball) or entirely surround a connection to the packaging connection (e.g., output ball).

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 4:
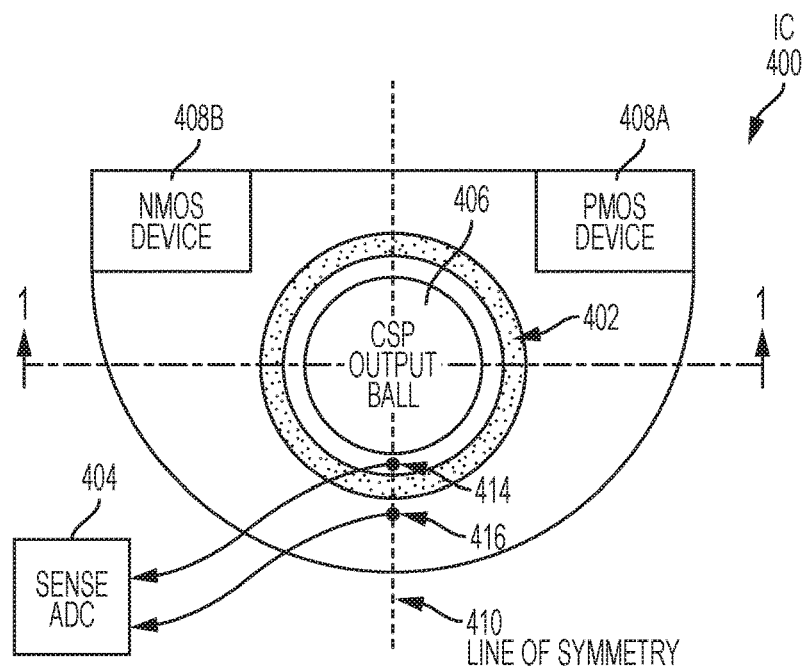
FIG. 4 is a top-down view showing an integrated circuit at a chip-scale package (CSP) level with an example non-straight integrated sense resistor according to one embodiment of the disclosure.
Figure 6:
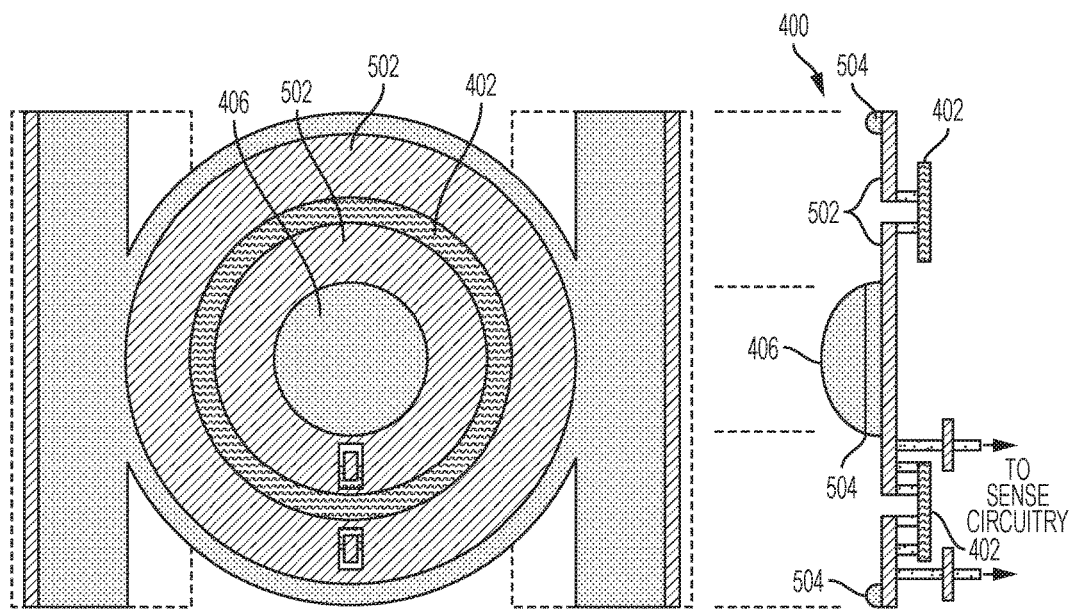
FIG. 6 is a top-down view showing an integrated circuit with an example non-straight sense resistor according to one embodiment of the disclosure.

In one embodiment, the integrated sense resistor is positioned near a Chip-Scale Package (CSP) output ball as shown in FIG. 4. FIG. 4 is a top-down view showing an integrated circuit at a chip-scale package (CSP) level with an example non-straight integrated sense resistor according to one embodiment of the disclosure. An integrated circuit (IC) 400 may include a sense ADC 404 coupled to a non-straight layered integrated sense resistor 402. The integrated circuit 400 is also shown in FIG. 6. FIG. 6 is a top-down view showing an integrated circuit with an example non-straight sense resistor and an example integration with other components of the integrated circuit according to one embodiment of the disclosure.

Figure 1:
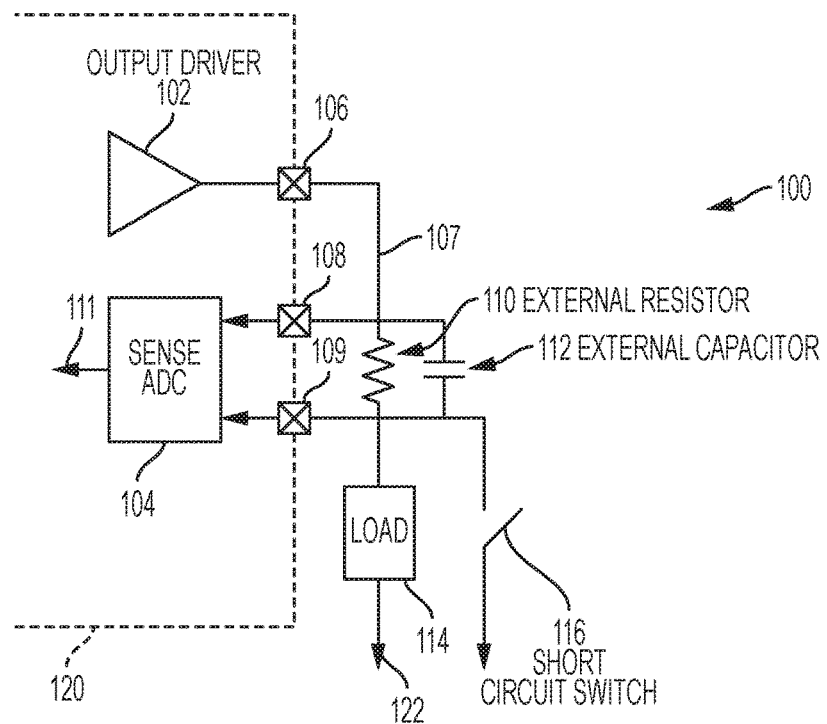
FIG. 1 is a circuit schematic showing a circuit accessing an external sense resistor according to one example of the prior art.
Figure 2:
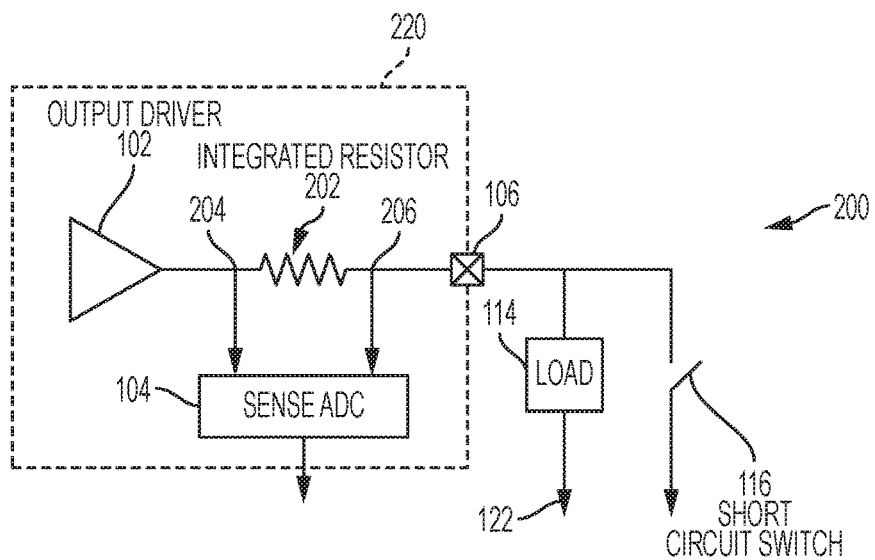
FIG. 2 is a circuit schematic showing a circuit having an integrated sense resistor according to one example of the prior art.

The sense resistor 402 shown in FIG. 4 is a circular shaped integrated sense resistor 402, however the sense resistor 402 may take other shapes, such as the shapes described above. Non-straight layered integrated sense resistor 402 can be formed as a resistor layer (e.g., integrated sense resistor layer). The sense resistor 402 may include any suitable material for an integrated circuit (IC), including Tantalum Nitride (TaN). Circular shaped integrated sense resistor 402 may be coupled to a pin or ball (e.g., CSP output ball) or other packaging connection 406 such that circular shaped integrated sense resistor 402 is surroundingly positioned or wrapped around a packaging connection, such as a pin or ball, (e.g., CSP output ball) 406 and/or positioned or wrapped around a connection (e.g., top metal 502 of FIG. 5) to the pin or ball 406. The circular shaped integrated sense resistor 402 may have more surface area but may be shaped to consume or take up less space or area within the IC 400 than the prior art straight layered integrated sense resistor solutions. The reduced space and/or larger surface area may be a result of the non-straight or circular shaped integrated sense resistor 402 being surroundingly positioned or wrapped around the pin or ball 306 (e.g., closer in proximity or in contact with the pin or ball 306). Also, because the circular shaped integrated sense resistor 402 is surroundingly positioned or wrapped around the pin or ball 406, the integrated sense resistor 402 is in closer proximity or in contact with the pin or ball 406, which may allow for more efficient dissipation of heat away from the integrated sense resistor 402 and onto an external board (not shown) to which the integrated circuit 402 is attached. Because the circular shaped integrated sense resistor 402 can be larger in surface area than prior art layered integrated sense resistors, circular shaped integrated sense resistor 402 may provide the ability to carry more current than conventional straight layered integrated sense resistors. In some embodiments, certain shapes, such as circular shapes, for the integrated sense resistor 402 may provide a current density that is more uniform than the current density that is provided with conventional integrated sense resistors, such as integrated sense resistor 202 of FIG. 2.

The sense resistor 402 may be coupled to circuitry for performing measurements within integrated circuit 400, including portions of IC 400 not shown. Contact with the sense resistor 402 may be made through sense points 414 and 416. In some embodiments, the sense points 414 and 416 may be located across the length of the circular shaped integrated sense resistor 402. The sense points 414 and 416 may be coupled to a sense analog-to-digital converter (ADC) 404.

The integrated circuit 400 may include other components near the integrated sense resistor 402. In one embodiment, the nearby components may include a n-type metal oxide semiconductor (NMOS) device 408B, such as a driver, comprising one or more n-channel transistors and a p-type metal oxide semiconductor (PMOS) device 408A, such as a driver, comprising one or more p-channel transistors. The combination of NMOS device 408B and PMOS device 408A may form complementary metal oxide semiconductor (CMOS) circuitry. In one embodiment, the devices 408A and 408B may be located at opposite sides of pin or ball 406.

The integrated circuit 400 may be easier to layout symmetrically around a line of symmetry 410 than conventional ICs with integrated sense resistors. The easier symmetrical layout may be a result of the non-straight or circular shape of integrated sense resistor 402 and/or the reduced space or area consumption compared to conventional integrated sense resistors. Mismatches among NMOS device 408B and PMOS device 408A that provide multiple current sources may be minimized or eliminated if sense points 414 and 416 are located along a line of symmetry 410. Symmetrical layout may be particularly important in embodiments having mismatch between the devices 408A and 408B, such as mismatches that occur with having multiple current sources. Although sense points 414 and 416 may be shown in certain positions in FIG. 4, the sense points may also be located in other positions. For example, multiple pairs of sense points may be used in the integrated circuit 400 and symmetry maintained if corresponding pairs are located at symmetric positions relative to the line of symmetry 410.

Figure 3:
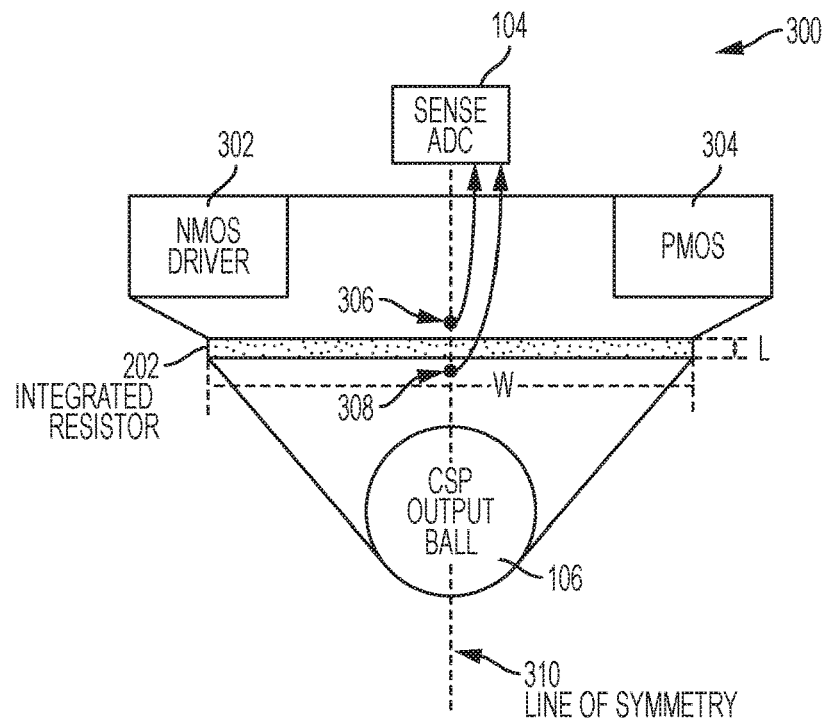
FIG. 3 is a top-down view showing an integrated circuit at a chip-scale package (CSP) level with an integrated sense resistor according to one example of the prior art.

Layout constraints of integrated circuit 400 may be eased compared with conventional circuits, such as circuit 300 of FIG. 3. The easier layout constraints may be a result of increased flexibility in the locations of sense points 414 and 416 for non-straight or circular shaped integrated sense resistor 402 compared with the conventional integrated sense resistor. Further, the layout constraints may be reduced by reducing die area consumed by the integrated sense resistor as a result of its non-straight shape. The design technique for laying out circuit 400 and providing a non-straight or circular shaped integrated sense resistor 402 may be particularly useful when the width W of the integrated sense resistor 402 is larger than the length L, where the width W may be the circumference of the resistor 402 and the length L may be the dimension radially across the resistor 402. Such a situation may arise in embodiments where a low resistance is needed, such as in embodiments that include a series resistance in a high current path.

Figure 5:
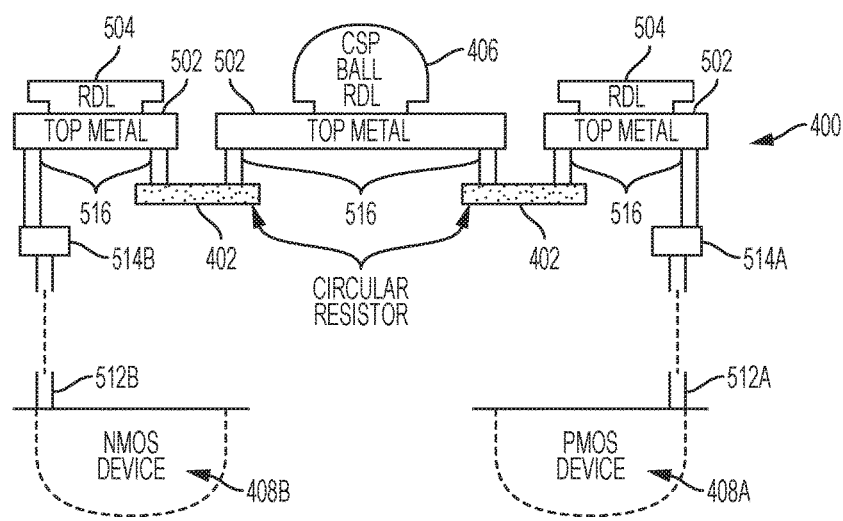
FIG. 5 is cross-sectional view showing an integrated circuit with an example non-straight sense resistor and an example integration with other components of the integrated circuit according to one embodiment of the disclosure.

Additional aspects of certain embodiments of an IC with integrated non-straight sense resistor are shown with respect to a cross section along line 1-1 of FIG. 4 in FIG. 4. FIG. 5 is plan cross-sectional view showing an integrated circuit with an example non-straight sense resistor and an example integration with other components of the integrated circuit according to one embodiment of the disclosure. The IC 400, the circular shaped integrated sense resistor 402, the pin/ball 406 (e.g., CSP output ball), and the devices 408A and 408B are shown in FIG. 5. The resistor layer (e.g., layer that forms circular shaped integrated sense resistor 402) may be placed or located below a top or upper metal layer 502 such that a redistribution layer (RDL) 504 may be used to minimize the metal resistance of the respective devices 408A and/or 408B, and also reduce or minimize mismatch between devices 408A and 408B.

Referring back to FIG. 4, if devices 408A and 408B are located on one side of pin/ball (e.g., CSP output ball) 406 (e.g., on one side of line 1-1) and sense points 414 and 416 are located along the line of symmetry 410 on the other side of pin/ball 406 (e.g., on the other side of line 1-1), then such a layout configuration generally maintains symmetry and minimizes the mismatches between the devices 408A and 408B for IC 400. As described above, more than two sense points may be present and symmetry maintained by locating them symmetrically in relation to the line of symmetry 410.

The layout in accordance to embodiments of the present disclosure can be advantageously used whenever a low resistance, high current resistor is needed or desired, particularly at a packaging connection, such as a CSP output pin or ball. Although a sense resistor is one application for embodiments of the present disclosure, they can also be used in other applications, such as to decouple a capacitive load from a driver. Many applications exist for the embodiments disclosed in the present disclosure, and they are not limited to just the sense resistor and other embodiments described in this disclosure.

In different embodiments, the non-straight shaped integrated sense resistor may partially or fully surround or wrap around an IC pin or ball. Thus, the non-straight shaped integrated sense resistor may have more surface area but consume or take up less space or die area within an IC than conventional integrated sense resistors. Further, the non-straight shaped integrated sense resistor may be in closer proximity or in contact with the pin or ball, which may allow it to efficiently dissipate heat away from the integrated sense resistor and onto an external board (not shown) to which the layout integrated circuit is mounted. In some embodiments, the non-straight shaped integrated sense resistor may be larger in surface area than conventional integrated sense resistors, even while consuming the same or less die area, which may allow a non-straight shaped integrated sense resistor to provide an ability to carry more current than conventional integrated sense resistors.

Figure 7:
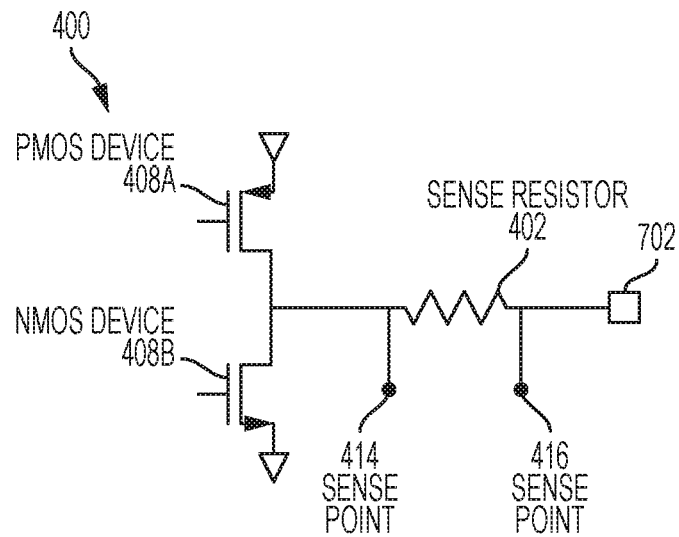
FIG. 7 is an example circuit showing a function of a non-straight sense resistor in an integrated circuit (IC) according to one embodiment of the disclosure.

A circuit representation of an IC with an integrated sense resistor is shown in FIG. 7. FIG. 7 is an example circuit showing a function of a non-straight sense resistor in an integrated circuit (IC) according to one embodiment of the disclosure. The IC 400 may be shown in a circuit schematic with an integrated resistor 402 with sense points 414 and 416 coupled between devices 408A and 408B. Device 408A may couple the integrated resistor 402 to a positive supply voltage; device 408B may couple the integrated resistor 402 to a ground or negative supply voltage. The devices 408A and 408B may drive a current to an output node 702, and the sense resistor 402 may be used to measure the current output to the output node 702.

Figure 8:
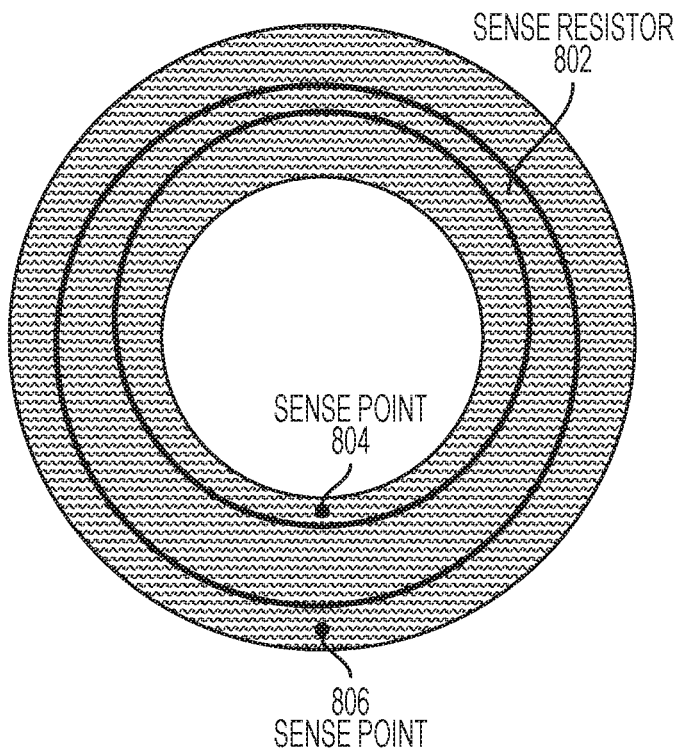
FIG. 8 is a top-down view showing an integrated circuit with an example non-straight sense resistor with varying length and/or offsets according to one embodiment of the disclosure.

As described above, the non-straight integrated sense resistor 402 may take on a number of shapes or structures. One embodiment of the integrated sense resistor 402 may have varying lengths and offsets within the sense resistor 402 as shown in FIG. 8. FIG. 8 is a top-down view showing an integrated circuit with an example non-straight sense resistor with varying lengths and offsets according to one embodiment of the disclosure. An integrated circuit may include an integrated non-straight sense resistor 802 having a varying length along various points of the circumference of the resistor 802 as a result of the circles having different radius and offset components. Sense points 804 and 806 may provide electrical contact to the sense resistor 802. Sense resistors with varying length, such as shown in FIG. 8, may be useful to compensate for unequal currents through the sense resistor.

Figure 9A:
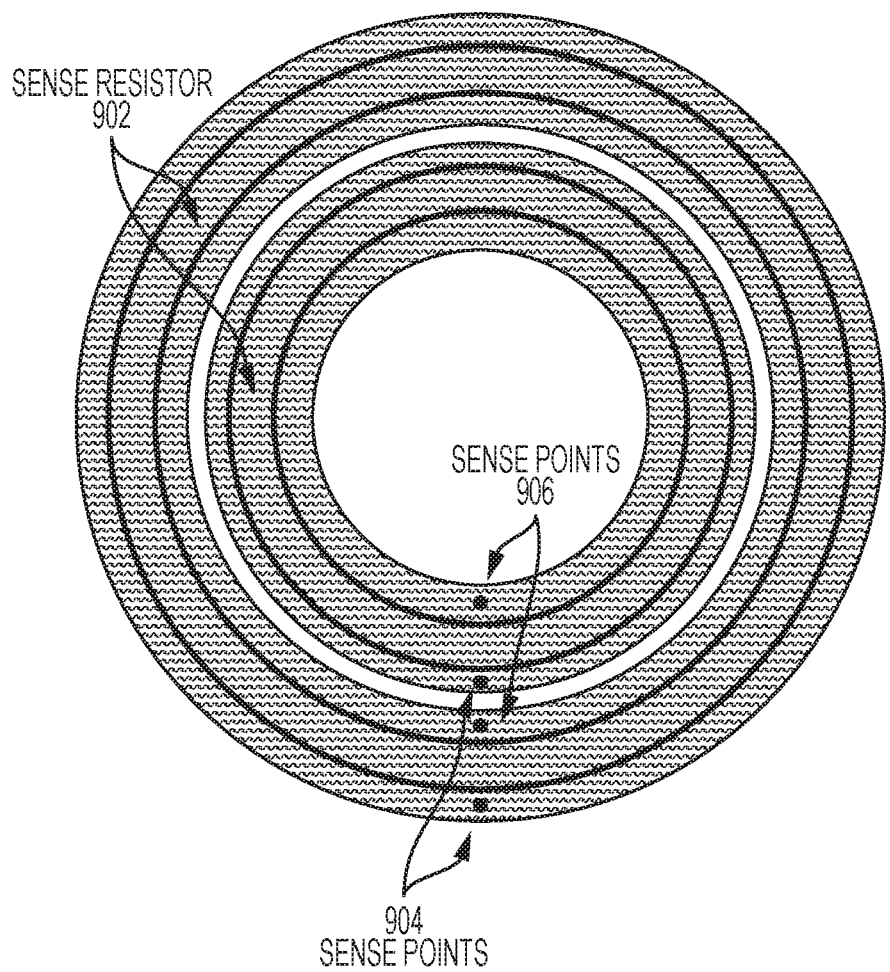
FIG. 9A is a top-down view showing an integrated circuit with an example non-straight sense resistor with multiple circles according to one embodiment of the disclosure.
Figure 9B:
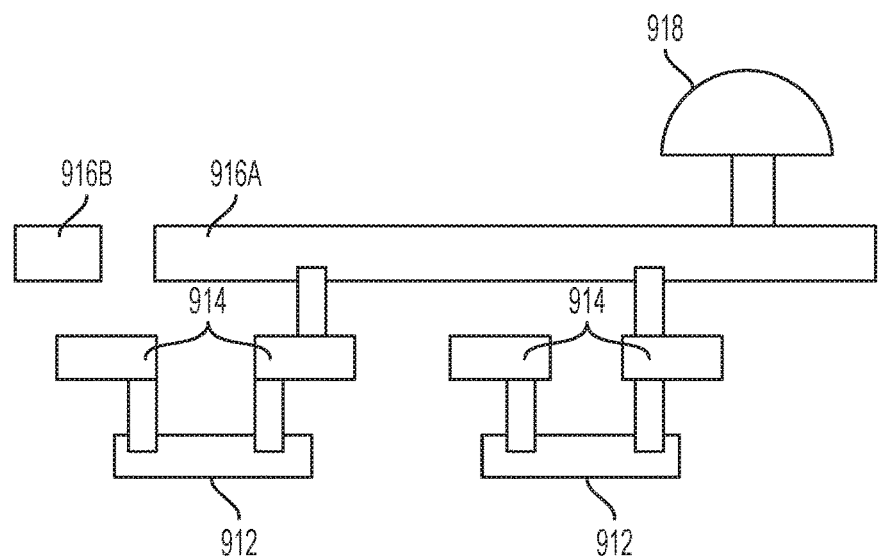
FIG. 9B is a cross-sectional view showing an integrated circuit with an example non-straight sense resistor with multiple circles according to one embodiment of the disclosure.

Yet another embodiment of the integrated sense resistor 402 may include multiple shapes, such as circles, positioned around each other, such as with concentric circles, as shown in FIGS. 9A-E. FIG. 9A is a top-down view showing an integrated circuit with an example non-straight sense resistor with multiple circles according to one embodiment of the disclosure. Sense resistors 902 may be formed from multiple, and optionally concentric, circles. Each of the circle sense resistors 902 may have two sense points for electrical contact to the sense resistors 902 shown as sense points 904 and 906. A cross-section through an integrated circuit of the multiple circle integrated sense resistors 902 is shown in FIG. 9B. Although the circles are shown as concentric circles, in which each circle has a common center and different diameter, the circles may also be slightly offset such that the circles do not share a common center.

Figure 9C:
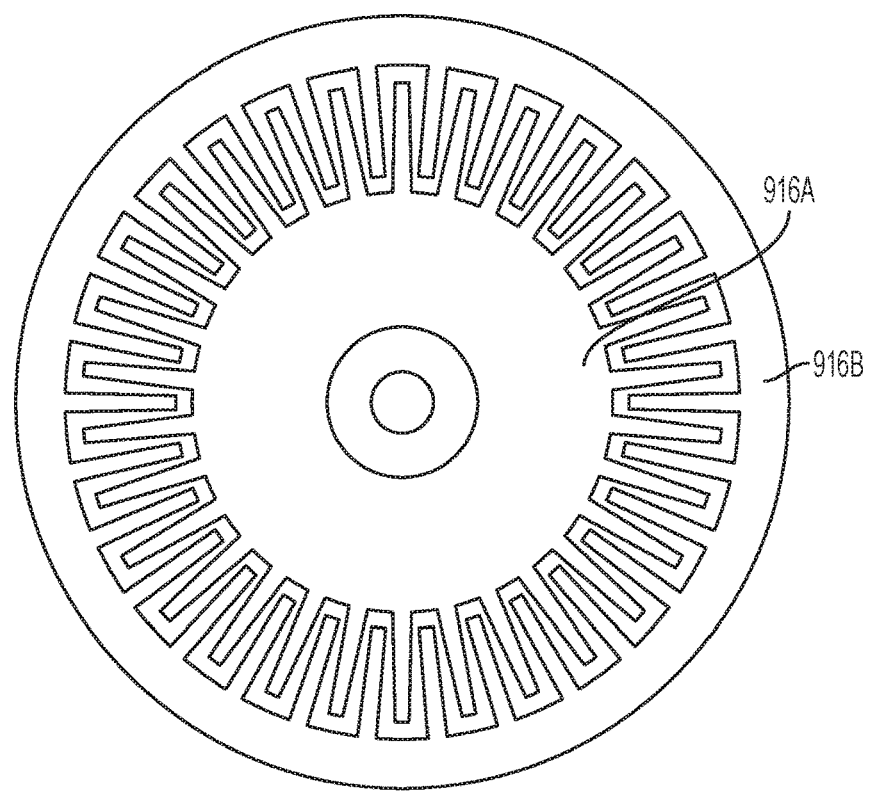
FIG. 9C is a top-down view showing a top metal layer of an integrated circuit with an example non-straight sense resistor with multiple circles according to one embodiment of the disclosure.
Figure 9D:
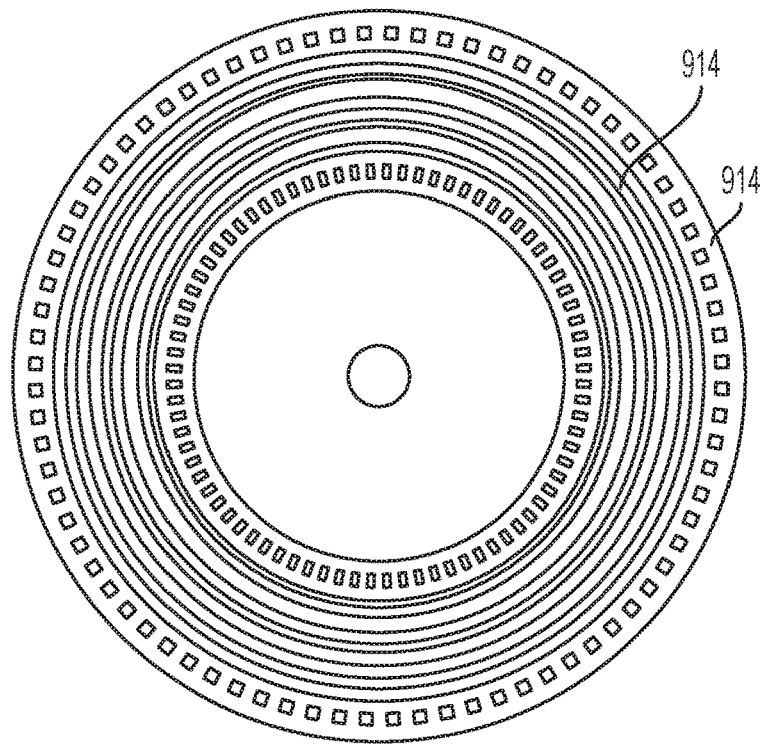
FIG. 9D is a top-down view showing a metal layer below the top metal layer of an integrated circuit with an example non-straight sense resistor with multiple circles according to one embodiment of the disclosure.

FIG. 9B is a cross-sectional view showing an integrated circuit with an example non-straight sense resistor with multiple circles according to one embodiment of the disclosure. The multiple circle sense resistors 902 may be formed from resistor layer 912, which may be made of a resistive material such as Tantalum Nitride (TaN). The resistor layer 912 may be coupled through a metal layer 914 to a top metal layer 916A-B. The top metal layer may be coupled to a packaging connection such as a pin or ball, or in one embodiment a CSP output ball 918. A top-down view of the top metal layer 916A-B of FIG. 9B is shown in FIG. 9C. FIG. 9C is a top-down view showing a top metal layer of an integrated circuit with an example non-straight sense resistor with multiple circles according to one embodiment of the disclosure. A top-down view showing a metal layer 914 under the top metal layer 916A-B is shown in FIG. 9D. FIG. 9D is a top-down view showing a metal layer below the top metal layer of an integrated circuit with an example non-straight sense resistor with multiple circles according to one embodiment of the disclosure.

Figure 9E:
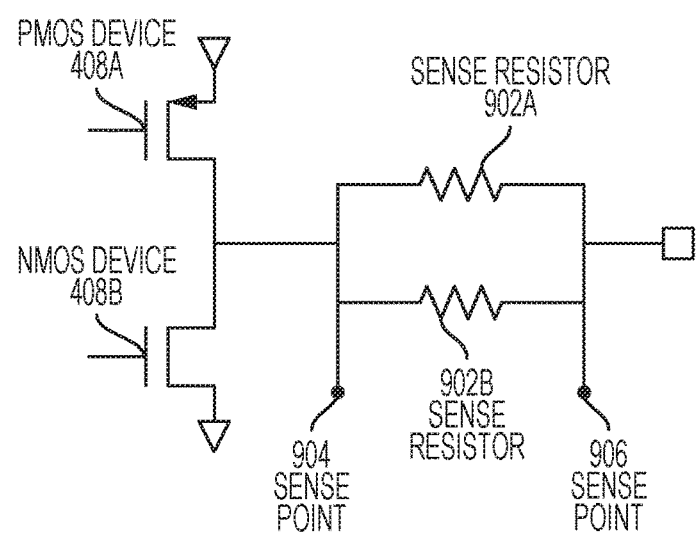
FIG. 9E is an example circuit showing a function of a non-straight sense resistor with multiple circles in an integrated circuit (IC) according to one embodiment of the disclosure.

The concentric circle integrated sense resistors may provide multiple resistances that may be accessed by an integrated circuit. In one example, the sense resistors may be coupled in parallel as shown in the circuit equivalent of FIG. 9E. FIG. 9E is an example circuit showing a function of a non-straight sense resistor with multiple circles in an integrated circuit (IC) according to one embodiment of the disclosure. The integrated circuit may include PMOS and NMOS devices 408A and 408B, respectively, as shown in other embodiments. The multiple circle integrated sense resistors are shown as resistors 902A and 902B coupled in parallel between sense points 904 and 906. Although only two resistors 902A and 902B are shown in FIG. 9E, additional resistances may be added with additional circles in the embodiments of FIGS. 9A-D.

For a desired total resistance value, implementing multiple rings as shown in FIGS. 9A-9E may reduce a current density in each individual ring. This may improve the electromigration performance of the integrated sense resistor and wiring, such as vias, coupled to the sense resistor to provide better reliability. The multiple rings may also reduce the voltage coefficient of the integrated sense resistance to obtain better resistance linearity. Further, the multiple rings may also reduce the self-heating as the same power is dissipated over a larger area than with a single ring to provide better resistance linearity even with the same temperature coefficient.

In one embodiment, an integrated circuit with multiple circle integrated sense resistors may provide current sensing through the integrated sense resistors with a low temperature coefficient. This may be particularly advantageous when a desired integrated sense resistor has a resistance value of less than a few Ohms, such as less than one Ohm.

The radius of the multiple rings may be as small as a radius of the packaging pin/ball, such that the mechanical stress of the assembly does not significantly affect the performance of the resistor ring. The radius of the multiple rings may be as large as the spacing of others balls in the integrated circuit allows, such that the concentric rings do not interfere with any other ball in the integrated circuit. A length of the multiple rings may be selected, in part, to obtain a desired resistance value for the integrated sense resistor. The length may also be affected by resistivity of the material of the sense resistor and expected current density through the multiple rings. The radius of the multiple rings or of a single ring is not limited in this way. The radius may be smaller than the packaging ball when it is fit below the packaging ball. The radius may also be larger to extend under other adjacent balls.

Figure 10:
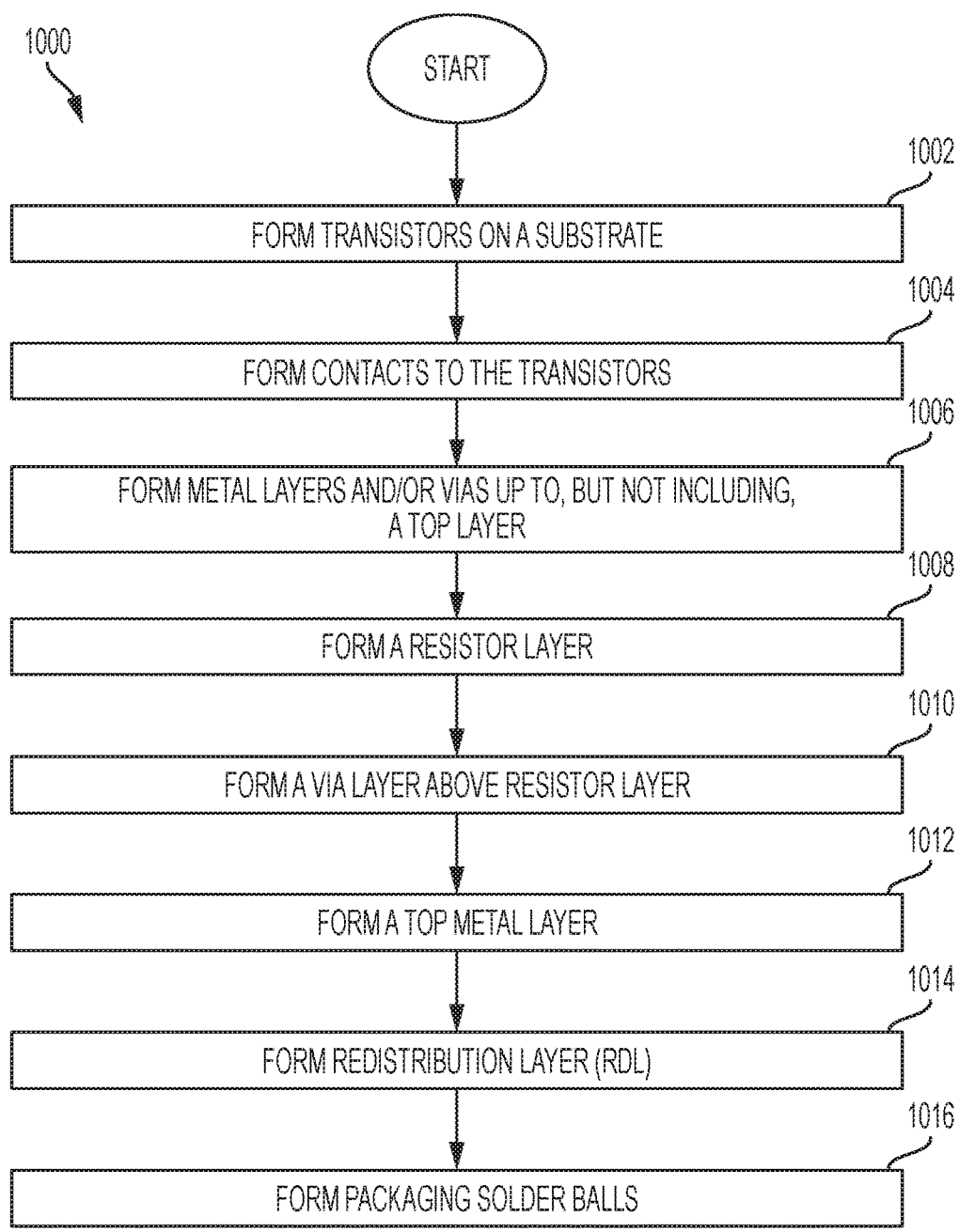
FIG. 10 is a flow chart showing an example manufacturing process for manufacturing an integrated circuit with integrated non-straight sense resistor according to one embodiment of the disclosure.

An integrated sense resistor may be manufactured using a combination of known semiconductor manufacturing techniques. One example of a new manufacturing process for manufacturing the integrated sense resistor in an integrated circuit is shown in FIG. 10. FIG. 10 is a flow chart showing an example manufacturing process for manufacturing an integrated circuit with integrated non-straight sense resistor according to one embodiment of the disclosure. A method 1000 may be used to manufacture an integrated circuit, such as integrated circuit 400 of FIG. 5. The IC 400 of FIG. 5 may be referred throughout the method 1000 as an example of an IC that may be manufactured according to the method 1000. However, the method 1000 may produce ICs other than IC 400 of FIG. 5 and/or may be adapted to produce ICs other than IC 400 of FIG. 5. For example, variations of method 1000 may be used to manufacture embodiments of the disclosure described with reference to FIG. 8 and FIG. 9 or the various shapes of integrated resistors described above or the other various embodiments described above.

The method 1000 may begin at block 1002 with forming transistors on a substrate. For example, PMOS and NMOS transistors may be formed on a silicon substrate, such as transistors found in devices 408A and 408B of FIG. 5. Next, at block 1004, contacts to the transistors may be formed. Contacts 512A and 512B may couple the devices 408A and 408B, respectively, to other layers and/or other components within IC 400. Then, at block 1006, metal layers and/or vias may be formed, to a top layer. For example, metal layers 514A and 514B may be formed to couple the contacts 512A and 512B to a top metal 502. Next, at block 1008, a resistor layer may be formed integrated with the IC. For example, integrated non-straight sense resistor 402 may be formed in the IC 400. At block 1008, the integrated sense resistor 402 may be formed in between some layers formed at block 1006, or the integrated sense resistor 402 may be formed after all of the layers but the top metal 502 are formed at block 1006. Then, at block 1010, a via layer may be formed above the resistor layer. For example, vias 516 may be formed above the integrated resistor 402 and/or metal layers 514A and 514B and/or above other metal layers. Next, at block 1012, a top metal layer may be formed on the IC. For example, the top metal 502 may be formed and coupled to the vias 516 that couple the top metal 502 to the integrated sense resistor 402 and/or the devices 408A and 408B. Then, at block 1014, a redistribution layer (RDL) may be formed on the top metal layer. For example, referring back to FIG. 5, the RDL 504 may be formed on the top metal 502. Next, at block 1016, packaging solder balls may be formed on the RDL. For example, referring back to FIG. 5, CSP ball 406 may be formed on the top metal 504.

The schematic flow chart diagram of FIG. 10 is generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An integrated circuit with an integrated resistor, the integrated circuit comprising:
a packaging connection of the integrated circuit; and
a non-straight resistor layer coupled to the packaging connection, wherein the non-straight resistor layer forms the integrated resistor within the integrated circuit, and wherein the non-straight resistor layer at least partially surrounds a connection to the packaging connection, and wherein the non-straight resistor layer is integrated in a same package as the integrated circuit, and wherein at least a portion of the non-straight resistor layer is physically located at a layer of the integrated circuit between the packaging connection and devices of the integrated circuit.

2. The integrated circuit of claim 1, wherein the non-straight resistor layer is a closed-shaped resistor layer.

3. The integrated circuit of claim 2, wherein the closed-shaped resistor layer comprises at least one of a circular integrated resistor layer, a rectangular integrated resistor layer, and a triangular integrated resistor layer.

4. The integrated circuit of claim 1, wherein the non-straight resistor layer is an open-ended resistor layer.

5. The integrated circuit of claim 4, wherein the open-ended shaped resistor layer comprises at least one of an open circular or semi-circular integrated resistor layer, an open-sided rectangular integrated resistor layer, an open-sided triangular integrated resistor layer, an angular shaped integrated resistor layer, and a curved shaped integrated resistor layer.

6. The integrated circuit of claim 1, wherein the non-straight resistor layer is coupled to the packaging connection such that the non-straight shape resistor layer at least partially surrounds a connection to the packaging connection, and wherein the non-straight shape resistor layer is coupled to the packaging connection such that the non-straight resistor layer entirely surrounds a connection the packaging connection.

7. The integrated circuit of claim 1, wherein the non-straight resistor layer comprises a non-straight resistor layer of varying length along a circumference of the non-straight resistor layer.

8. The integrated circuit of claim 1, wherein the non-straight resistor layer comprises multiple circles of varying sizes.

9. The integrated circuit of claim 1, wherein the integrated circuit comprises:
a p-type metal-oxide-semiconductor (PMOS) device;
an n-type metal-oxide-semiconductor (NMOS) device coupled to the p-type metal-oxide-semiconductor (PMOS) device,
wherein the integrated resistor is coupled to the p-type metal-oxide-semiconductor (PMOS) device and coupled to the n-type metal-oxide-semiconductor (NMOS) device.

10. The integrated circuit of claim 1, further comprising:
a first sense point coupled to the integrated resistor; and
a second sense point coupled to the integrated resistor.

11. The integrated circuit of claim 10, wherein the first sense point and the second sense point are located approximately symmetric relative to a line of symmetry corresponding to the packaging connection.

12. The integrated circuit of claim 1, wherein the packaging connection comprises a chip-scale packaging (CSP) ball.

13. A method of forming an integrated resistor for an integrated circuit, comprising:
forming a non-straight resistor layer; and
coupling the non-straight resistor layer to a packaging connection of the integrated circuit,
wherein the step of forming the non-straight resistor layer comprises forming the non-straight resistor layer to at least partially surround a connection to the packaging connection, and wherein the non-straight resistor layer is integrated in a same package as the integrated circuit, and wherein at least a portion of the non-straight resistor layer is physically located at a layer of the integrated circuit between the packaging connection and devices of the integrated circuit.

14. The method of claim 13, wherein the step of forming the non-straight resistor layer comprises shaping the non-straight resistor layer as a closed-shaped resistor layer.

15. The method of claim 14, wherein the step of forming the non-straight resistor layer comprises shaping the closed-shaped resistor to be at least one of a circular resistor layer, a rectangular resistor layer, and a triangular resistor layer.

16. The method of claim 13, wherein the step of forming the non-straight resistor layer comprises shaping the non-straight shape resistor layer as an open-ended shaped resistor layer.

17. The method of claim 16, wherein the step of forming the non-straight resistor layer comprises shaping the open-ended shaped resistor layer as an open circular resistor layer, an open semi-circular resistor layer, an open-sided rectangular resistor layer, an open-sided triangular resistor layer, an angular shaped integrated resistor layer, and a curved shaped resistor layer.

18. The method of claim 13, wherein the step of forming the non-straight resistor layer comprises shaping the non-straight shape resistor layer to entirely surround a connection to the packaging connection.

19. The method of claim 18, wherein the step of forming the non-straight resistor layer comprises shaping the non-straight shape resistor layer to entirely surround a connection to the packaging connection and be in contact with the connection to the packaging connection.

20. The method of claim 13, wherein the step of forming the non-straight resistor layer comprises shaping the non-straight resistor layer as multiple circles with varying sizes.

21. The method of claim 13, wherein the step of forming the non-straight resistor layer comprises shaping the non-straight resistor layer with a varying length.

\* \* \* \* \*